United States Patent
Lin

(10) Patent No.: US 9,681,564 B2
(45) Date of Patent: Jun. 13, 2017

(54) PANEL STRUCTURE OF POWER APPARATUS

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 14/858,536

(22) Filed: Sep. 18, 2015

(65) Prior Publication Data
US 2017/0086330 A1    Mar. 23, 2017

(51) Int. Cl.
| H05K 5/03 | (2006.01) |
| H05K 7/20 | (2006.01) |
| H05K 5/00 | (2006.01) |
| H05K 5/02 | (2006.01) |

(52) U.S. Cl.
CPC ............ *H05K 5/03* (2013.01); *H05K 5/0008* (2013.01); *H05K 7/20127* (2013.01); *H05K 5/0239* (2013.01)

(58) Field of Classification Search
USPC ........................ 361/679.46–679.54, 688–723; 165/80.1–80.3; 174/16.1, 16.3, 547–548; 454/184
See application file for complete search history.

(56) References Cited

U.S. PATENT DOCUMENTS

| 5,549,345 | A | * | 8/1996 | Cawthon | B60H 1/3407 296/208 |
| 6,310,770 | B1 | * | 10/2001 | Negishi | H05K 7/20581 361/695 |
| 7,176,771 | B2 | * | 2/2007 | Faber | H01H 9/342 335/201 |
| 7,575,617 | B2 | * | 8/2009 | Ferguson | B01D 46/10 454/309 |
| D619,108 | S | * | 7/2010 | Lin | D13/177 |
| 7,922,003 | B2 | * | 4/2011 | Timmerman | B07B 1/46 209/395 |
| D659,108 | S | * | 5/2012 | Lin | D13/177 |
| D659,653 | S | * | 5/2012 | Lin | D13/177 |
| 8,410,362 | B1 | * | 4/2013 | Lin | H02G 3/14 174/66 |
| 2002/0080580 | A1 | * | 6/2002 | Heard | H05K 9/0041 361/690 |
| 2007/0084163 | A1 | * | 4/2007 | Lai | G06F 1/20 55/385.6 |

(Continued)

*Primary Examiner* — Zachary M Pape
*Assistant Examiner* — Amir Jalali
(74) *Attorney, Agent, or Firm* — Ming Chow; Sinorica, LLC

(57) ABSTRACT

A panel structure of a power apparatus is provided. The power apparatus includes a case. The front of the case is longitudinally provided with a panel. The panel is transversely formed with at least two parallel heat dissipation holes. The panel is formed with a connecting portion between the heat dissipation holes. A heat dissipation net is provided on the heat dissipation holes. The heat dissipation net is formed with a plurality of openings corresponding to the connecting portion. A reinforcement rib is provided on the connecting portion, preventing the panel from collapsing or deforming. The durability of the panel is increased, and the appearance of the panel is pleasing to the eye.

4 Claims, 5 Drawing Sheets

(56) References Cited

U.S. PATENT DOCUMENTS

| | | | |
|---|---|---|---|
| 2007/0204972 A1* | 9/2007 | Edward | H01L 23/373 165/80.3 |
| 2010/0313499 A1* | 12/2010 | Gangemi | F24J 2/52 52/173.3 |
| 2014/0124417 A1* | 5/2014 | Holton | B07B 1/46 209/412 |
| 2015/0096479 A1* | 4/2015 | McCarthy | F41H 5/04 109/1 S |

* cited by examiner

PANEL STRUCTURE OF POWER APPARATUS

BACKGROUND OF THE INVENTION

1. Field of the Invention

The present invention relates to a panel structure, and more particularly to a panel structure used for a power apparatus.

2. Description of the Prior Art

When a power apparatus runs, the electronic components of the power apparatus will generate heat to bring a high temperate. As a result, the electronic components may be damaged due to the high temperature. In general, the power apparatus is provided with radiating fins, fans or the like therein, alternatively, the panel of the power apparatus is formed with a plurality of ventilating holes and a heat dissipation net is provided on the ventilating holes, enabling the power apparatus to dissipate heat. When the ventilating holes of the panel have a certain area, the panel may collapse or deform easily. Therefore, the ventilating holes are provided with ribs to support the panel so that the panel can achieve the desired effect.

Although the ribs can prevent the panel from collapsing or deforming, the procedure to manufacture the panel becomes complicated and the appearance of the panel may be influenced. Accordingly, the inventor of the present invention has devoted himself based on his many years of practical experiences to solve these problems.

SUMMARY OF THE INVENTION

The primary object of the present invention is to provide a panel structure of a power apparatus. The panel is durable, and the appearance of the panel is pleasing to the eye.

In order to achieve the object, the power apparatus comprises a case. The front of the case is longitudinally provided with a panel. The panel is formed with a plurality of heat dissipation holes for the case to dissipate heat. The panel is transversely formed with at least two parallel heat dissipation holes. The panel is formed with a connecting portion between the heat dissipation holes. A heat dissipation net is provided on the heat dissipation holes. The heat dissipation net is formed with a plurality of openings corresponding to the connecting portion. A reinforcement rib is vertically disposed at the inner side of the connecting portion. The reinforcement rib is an elongate plate. The reinforcement rib has a long side parallel to a long side of the connecting portion.

Accordingly, the connection portion formed between the heat dissipation holes is provided with the reinforcement ribs, preventing the panel from collapsing or deforming. The durability of the panel is increased, and the appearance of the panel is pleasing to the eye.

DETAILED DESCRIPTION OF THE PREFERRED EMBODIMENTS

Embodiments of the present invention will now be described, by way of example only, with reference to the accompanying drawings.

Figure 1:
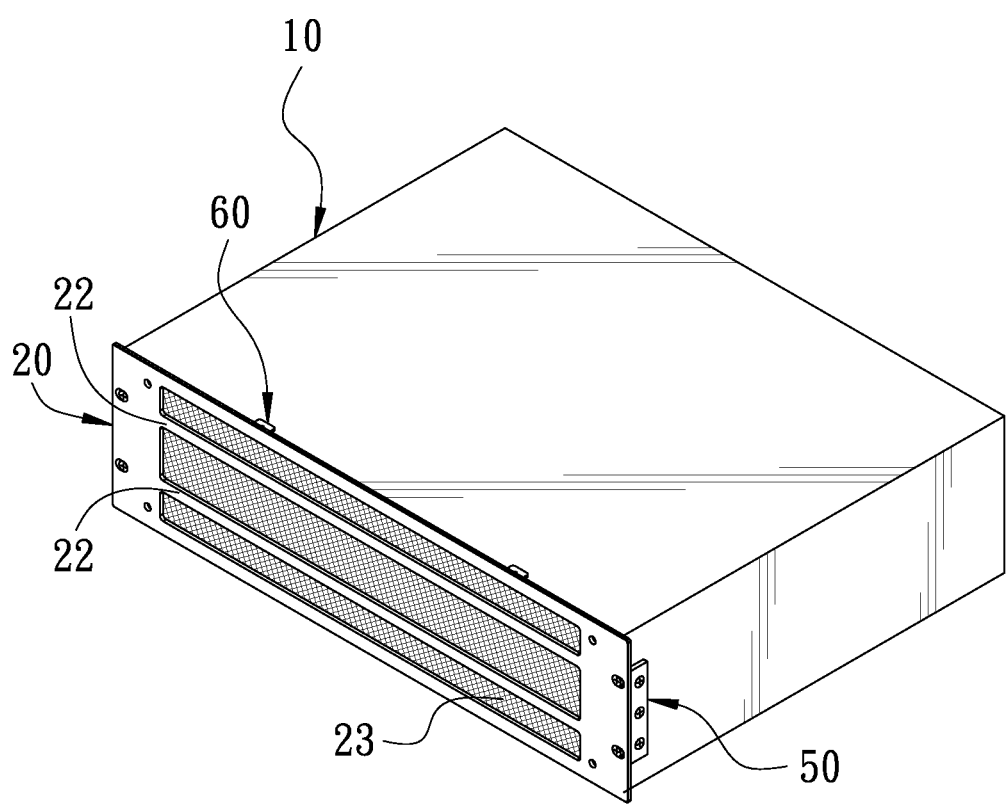
FIG. 1 is a perspective view showing that the panel is mounted on the case according to a preferred embodiment of the present invention.
Figure 2:
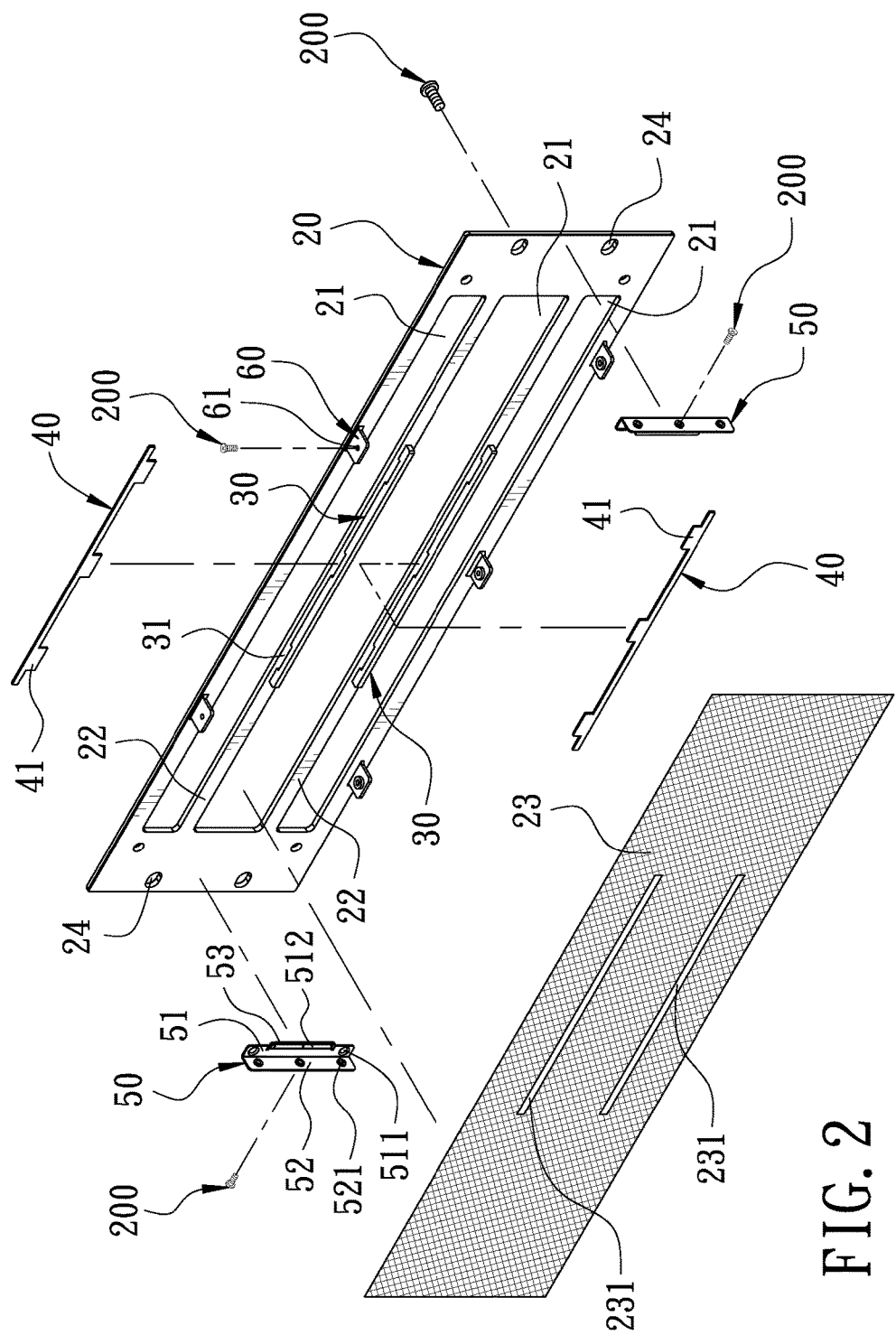
FIG. 2 is an exploded view of the preferred embodiment of the present invention.

FIG. 1 is a perspective view showing that a panel according to a preferred embodiment of the present invention is mounted on a case. FIG. 2 is an exploded view of the preferred embodiment of the present invention. The present invention discloses a panel structure of a power apparatus. The power apparatus comprises a case 10. The front of the case 10 is longitudinally provided with a panel 20.

The panel 20 is transversely formed with at least two parallel heat dissipation holes 21. The heat dissipation holes 21 are adapted for the case 10 to dissipate heat. The panel 20 is formed with a connecting portion 22 between the heat dissipation holes 21. A heat dissipation net 23 is provided on the heat dissipation holes 21. The heat dissipation net 23 is formed with a plurality of openings 231 corresponding to the connecting portion 22. In this preferred embodiment of the present invention, left and right sides of the panel 20 are formed with a plurality of apertures 24, respectively.

A reinforcement rib 30 is provided and vertically disposed at the inner side of the connecting portion 22. The reinforcement rib 30 is an elongate plate. The reinforcement rib 30 has a long side parallel to a long side of the connecting portion 22. In this preferred embodiment of the present invention, the bottom of the reinforcement rib 30 is formed with a plurality of engaging recesses 31.

At least one fixing plate 40 is provided. The fixing plate 40 is formed with stop pieces 41 extending downward and corresponding in position to the engaging recesses 31. When the fixing plate 40 is engaged with the reinforcement rib 30, the stop pieces 41 are adapted to fix the heat dissipation net 23.

Two L-shaped locking units 50 are provided and disposed at the left and right sides of the panel 20, respectively. The L-shaped locking units 50 each have a first locking piece 51 parallel to the panel 20 and a second locking piece 52 perpendicular to the panel 20. The first locking piece 51 is formed with a plurality of through holes 511 corresponding to the apertures 24. The second locking piece 52 is formed with a plurality of locking holes 521. The through holes 511 and the locking holes 521 are provided with screws 200 respectively for the first locking piece 51 to be locked to the panel 20 and the second locking piece 52 to be locked to the case 10. Furthermore, a retaining piece 512 extends from a middle section of the first locking piece 51. The retaining piece 512 protrudes out of the first locking piece 51. A spacer 53 is provided under the retaining piece 512. A gap is formed between the spacer 53 and the panel 20 for the heat dissipation net 23 to be inserted therein.

A plurality of connecting pieces 60 are provided and vertically disposed at upper and lower sides of the panel 20. The connecting pieces 60 each have a screw hole 61. The screw hole 61 is provided with a screw 200 for the panel 20 to be locked to the case 10.

Figure 3:
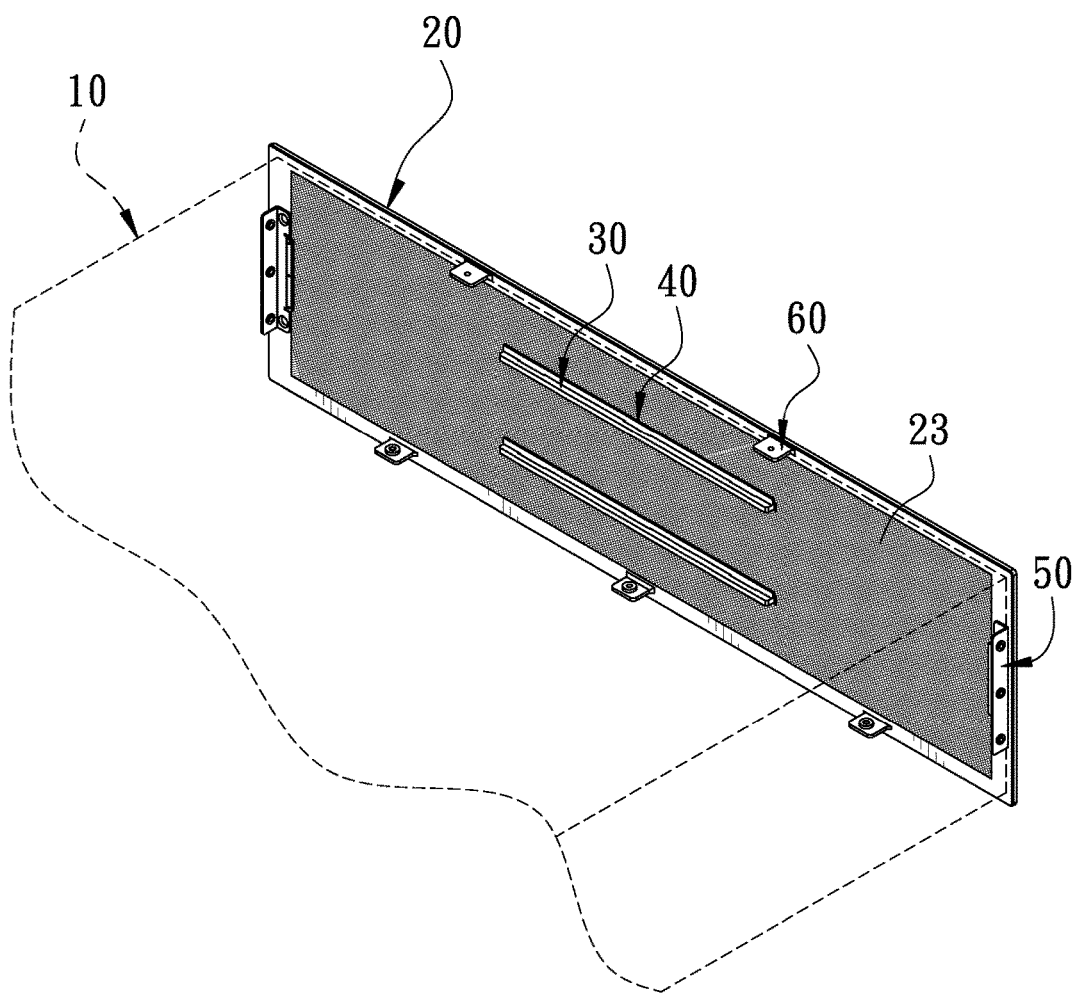
FIG. 3 is a schematic view of the preferred embodiment of the present invention when in use.
Figure 4:
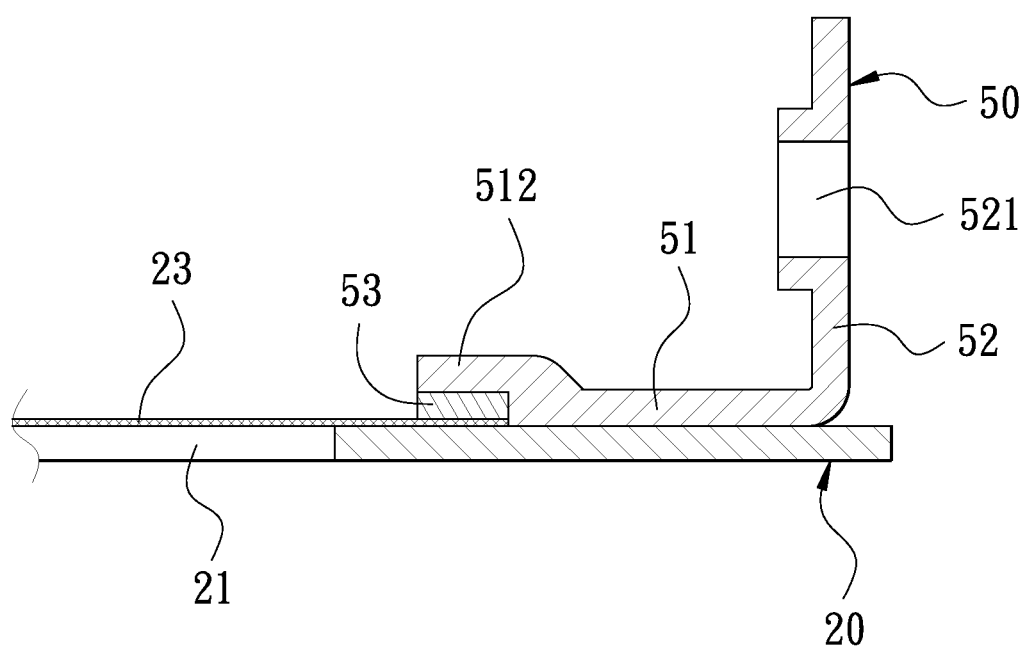
FIG. 4 is a sectional view showing the L-shaped locking unit to lock the heat dissipation net according to the preferred embodiment of the present invention.
Figure 5:
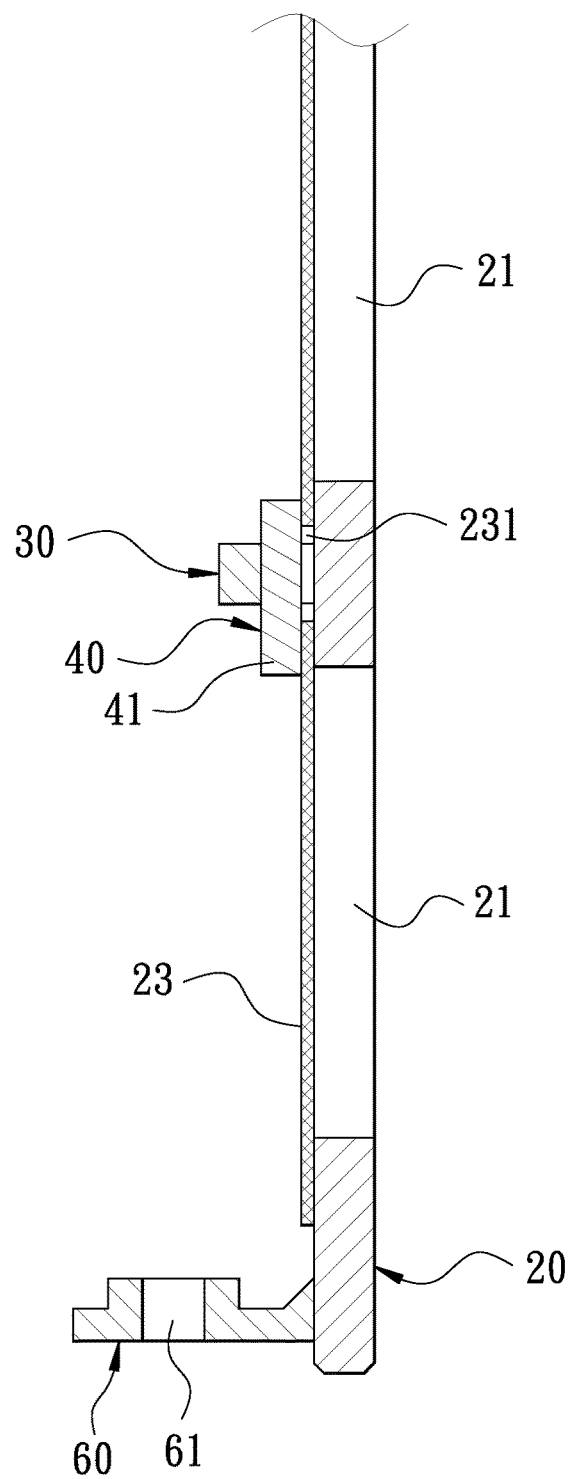
FIG. 5 is a sectional view showing the fixing plate to fix the heat dissipation net according to the preferred embodiment of the present invention.

FIG. 3 is a schematic view of the preferred embodiment of the present invention when in use. FIG. 4 is a sectional view showing the L-shaped locking unit to lock the heat dissipation net according to the preferred embodiment of the present invention. FIG. 5 is a sectional view showing the fixing plate to fix the heat dissipation net according to the preferred embodiment of the present invention. In cooperation with the FIG. 1 and FIG. 2, when the user wants to mount the panel 20 on the case 10, the heat dissipation net 23 is first mounted on the panel 20. The heat dissipation net 23 is placed corresponding in position to the heat dissipation holes 21. The openings 231 of the heat dissipation net 23 is aligned with the connecting portion 22. As shown in FIG. 3, two sides of the heat dissipation net 23 are inserted into the gaps between spacers 53 of the L-shaped locking units 50 and the panel 20. Through the screws 200, the first locking pieces of the L-shaped locking units 50 are locked to the panel 20, so that the two sides of the heat dissipation net 23 are secured. The reinforcement ribs 30 are placed into the openings 231 of the heat dissipation net 23. The fixing plates 40 are connected with the reinforcement ribs 30 respectively, with the stop pieces 41 to engage with the corresponding engaging recesses 31. The fixing plates 40 stride over the openings 231, as shown in FIG. 4, such that the upper and lower sides of the openings 231 of the heat dissipation net 23 are retained. After that, the screws 200 are screwed to the locking holes 521 of the second locking pieces 52 and locked to the left and right sides of the case 10. The screws 200 are screwed to the screw holes 61 of the connecting pieces 60 and locked to the upper and lower sides of the case 10. In this way, the panel 20 is securely fixed to the case 10. When the case 10 is running to generate heat, the heat dissipation holes 21 of the panel 20 are adapted to dissipate heat. The reinforcement ribs 30 provided on the connecting portion 22 is able to reinforce the strength of the connecting portion 22. Thus, the L-shaped locking units 50 and the fixing plates 40 provide a simply way to fix the heat dissipation net 23 so as to enhance the convenience of the heat dissipation net 23. The connecting portion 22 formed between the heat dissipation holes 21 is provided with the reinforcement ribs 30, preventing the panel 20 from collapsing or deforming. The durability of the panel 20 is increased, and the appearance of the panel 20 is pleasing to the eye.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A panel structure of a power apparatus, the power apparatus comprising a case, a front of the case being longitudinally provided with a panel, the panel being formed with a plurality of heat dissipation holes for the case to dissipate heat, characterized by:

the heat dissipation holes being formed parallel on the panel, the panel being formed with a connecting portion between the heat dissipation holes, a heat dissipation net being provided on the heat dissipation holes, the heat dissipation net being formed with a plurality of openings corresponding to the connecting portion;

a reinforcement rib being vertically disposed at an inner side of the connecting portion, the reinforcement rib being an elongate plate, the reinforcement rib having a long side parallel to a long side of the connecting portion;

a bottom of the reinforcement rib being formed with a plurality of engaging recesses; and the panel further comprises at least one fixing plate, the fixing plate is formed with stop pieces extending downward and corresponding in position to the engaging recesses, the fixing plate is secured to the reinforcement rib, and the stop pieces are adapted to fix the heat dissipation net.

2. The panel structure of the power apparatus as claimed in claim 1, wherein left and right sides of the panel are formed with a plurality of apertures, respectively.

3. The panel structure of the power apparatus as claimed in claim 2, wherein the panel further comprises two L-shaped locking units disposed at the left and right sides of the panel respectively, the L-shaped locking units each have a first locking piece parallel to the panel and a second locking piece perpendicular to the panel, the first locking piece is formed with a plurality of through holes corresponding to the apertures, the second locking piece is formed with a plurality of locking holes, the through holes and the locking holes are provided with screws respectively for the first locking piece to be locked to the panel and the second locking piece to be locked to the case, a retaining piece extends from a middle section of the first locking piece, the retaining piece protrudes out of the first locking piece, a spacer is provided under the retaining piece, and a gap is formed between the spacer and the panel for the heat dissipation net to be inserted therein.

4. The panel structure of the power apparatus as claimed in claim 1, wherein the panel further comprises a plurality of connecting pieces vertically disposed at upper and lower sides of the panel, the connecting pieces each have a screw hole, and the screw hole is provided with a screw for the panel to be locked to the case.

* * * * *